United States Patent
Chen et al.

(10) Patent No.: US 11,989,499 B2
(45) Date of Patent: May 21, 2024

(54) METHOD AND APPARATUS FOR ADJUSTING METAL WIRING DENSITY

(71) Applicant: CHANGXIN MEMORY TECHNOLOGIES, INC., Hefei (CN)

(72) Inventors: Chuanjiang Chen, Hefei (CN); Li Tang, Hefei (CN); Li Bai, Hefei (CN); Kang Zhao, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 327 days.

(21) Appl. No.: 17/647,619

(22) Filed: Jan. 11, 2022

(65) Prior Publication Data

US 2023/0014017 A1     Jan. 19, 2023

Related U.S. Application Data (63) Continuation of application No. PCT/CN2021/113422, filed on Aug. 19, 2021.

(30) Foreign Application Priority Data

Jul. 6, 2021 (CN) .......................... 202110762129.6

(51) Int. Cl.
    *G06F 30/394*     (2020.01)
    *G06F 30/392*     (2020.01)

(52) U.S. Cl.
    CPC .......... *G06F 30/394* (2020.01); *G06F 30/392* (2020.01)

(58) Field of Classification Search
    USPC ................. 716/110, 111, 112, 118, 119, 120
    See application file for complete search history.

(56) References Cited

U.S. PATENT DOCUMENTS 7,240,314 B1    7/2007   Leung

FOREIGN PATENT DOCUMENTS

| CN | 102542119 B | | 1/2014 |
|---|---|---|---|
| CN | 103838887 A | * | 6/2014 |
| CN | 103838887 A | | 6/2014 |
| CN | 109002566 A | | 12/2018 |
| CN | 110705203 A | | 1/2020 |
| CN | 112287631 A | | 1/2021 |
| JP | 2009130228 A | * | 6/2009 |
| JP | 2009130228 A | | 6/2009 |

OTHER PUBLICATIONS

International Search Report cited in PCT/CN2021/113422 mailed Mar. 16, 2022, 8 pages.

* cited by examiner

*Primary Examiner* — Brian Ngo
(74) *Attorney, Agent, or Firm* — Cooper Legal Group, LLC (57) ABSTRACT

Embodiments of the present application provide a method and an apparatus for adjusting metal wiring density. By detecting metal wiring density in each of metal density detection windows in a target layout, a region in which the metal wiring density is greater than a preset density threshold can be quickly positioned in the target layout, thereby improving the layout correction efficiency; then a power fill mesh in a target metal density detection window in which the metal wiring density is greater than the preset density threshold is cropped multiple times, until the metal wiring density in each of the metal density detection windows is less than or equal to the preset density threshold, such that sufficient power fill meshes are retained in the target layout while the metal wiring density of the target layout is less than or equal to the preset density threshold.

16 Claims, 6 Drawing Sheets

METHOD AND APPARATUS FOR ADJUSTING METAL WIRING DENSITY

CROSS-REFERENCE TO RELATED APPLICATIONS

This is a continuation of International Patent Application No. PCT/CN2021/113422, filed on Aug. 19, 2021, which claims the priority to Chinese Patent Application No. 202110762129.6, titled "METHOD AND APPARATUS FOR ADJUSTING METAL WIRING DENSITY" and filed to China National Intellectual Property Administration on Jul. 6, 2021. The entire contents of International Patent Application No. PCT/CN2021/113422 and Chinese Patent Application No. 202110762129.6 are incorporated herein by reference.

TECHNICAL FIELD

The present application relates to the technical field of integrated circuits, and in particular, to a method and an apparatus for adjusting metal wiring density.

BACKGROUND

With the continuous evolution of the semiconductor process, the width of the metal wire in the chip is getting narrower, resulting in a larger resistance value on the metal wire. At the same time, the supply voltage of the chip is decreasing, which makes the IR drop of the chip more obvious, and the serious IR drop greatly affects the performance and even function of the whole chip.

In order to reduce the voltage drop of the chip, the resistance on the power mesh is usually reduced by increasing the density of the power mesh in the layout. Such a method of increasing the density of the power mesh in the layout is also known as adding power fill meshes to the layout.

However, since the metal wires are extremely dense in the layout, the added power fill meshes and the existing metal wires in the layout together easily result in an excessively high metal wiring density of the layout, which affects the planarization of the wafer surface by the chemical mechanical polishing (CMP) process. Therefore, when the metal wiring density of the layout is excessively high, how to efficiently correct the power fill meshes to reduce the metal wiring density of the layout to below a given threshold is an urgent technical problem to be solved.

SUMMARY

Embodiments of the present application provide a method and an apparatus for adjusting metal wiring density.

According to a first aspect, an embodiment of the present application provides a method for adjusting metal wiring density, including:

detecting metal wiring density in each of metal density detection windows in a target layout;

when there is a target metal density detection window in which the metal wiring density is greater than a preset density threshold among the metal density detection windows, cropping a power fill mesh in the target metal density detection window; and returning to detect the metal wiring density in each of the metal density detection windows in the target layout, until the metal wiring density in each of the metal density detection windows in the target layout is less than or equal to the preset density threshold.

According to a second aspect, an embodiment of the present application provides an apparatus for adjusting metal wiring density, including:

a detection module, configured to detect metal wiring density in each of metal density detection windows in a target layout; and a processing module, configured to: when there is a target metal density detection window in which the metal wiring density is greater than a preset density threshold among the metal density detection windows, crop a power fill mesh in the target metal density detection window; and return to run the detection module, until the metal wiring density in each of the metal density detection windows in the target layout is less than or equal to the preset density threshold.

According to a third aspect, an embodiment of the present application provides electronic device, including: at least one processor and a memory, where the memory stores computer executable instructions; and
the at least one processor executes the computer executable instructions stored by the memory, such that the at least one processor performs the method for adjusting metal wiring density as described in the first aspect.

According to a fourth aspect, an embodiment of the present application provides a computer readable storage medium, where the computer readable storage medium stores computer executable instructions, and when the computer executable instructions are executed by a processor, the method for adjusting metal wiring density as described in the first aspect is implemented.

DETAILED DESCRIPTION

In order to make the objectives, technical solutions and advantages of the embodiments of the present application clearer, the following clearly and completely describes the technical solutions in the embodiments of the present application with reference to the accompanying drawings in the embodiments of the present application. Apparently, the described embodiments are some rather than all of the embodiments of the present application. All other embodiments obtained by those of ordinary skill in the art based on the embodiments of the present application without creative efforts should fall within the protection scope of the present application. In addition, although disclosures in the present application are presented according to one or multiple exemplary examples, it should be understood that each aspect of these disclosures can also individually constitute a complete implementation.

It should be noted that brief descriptions of the terms in the present application are used only to facilitate the understanding of the implementations described below, and are not intended to limit the implementations of the present application. Unless otherwise stated, these terms should be understood according to their ordinary and usual meanings.

In this specification, the claims, and the accompanying drawings of the present application, the terms "first", "second", and so on are intended to distinguish similar or like objects or entities but do not necessarily indicate a specific order or sequence, unless otherwise noted. It should be understood that the terms used in such a way are interchangeable in proper circumstances, for example, can enable implementation in other sequences than those illustrated or described in the embodiments of the present application.

In addition, the terms "including" and "having" and any variations thereof are intended to cover non-exclusive inclusion. For example, for products or devices that include a series of components, the components are not necessarily limited to those clearly listed, but may include other components not clearly listed or inherent to these products or devices.

The term "module" as used in the present application refers to any known or later developed hardware, software, firmware, artificial intelligence, fuzzy logic or combination of hardware or/and software code that can perform the functions associated with the component.

Currently, in order to reduce the voltage drop of the chip, the equivalent resistance from the power pad to the logic gate unit is usually reduced by increasing the density of the power mesh in the layout design stage of the chip. When the resistance on the power mesh is reduced, the IR drop on the power mesh is also reduced.

This method of increasing the density of the power mesh in the layout is also known as adding power fill meshes to the layout. Specifically, large power fill meshes are added to the layout for each layer of metal wires connected to the power. These power fill meshes help reduce the resistance on the power mesh and thus reduce the IR drop on the power mesh.

However, since the metal wires are extremely dense in the layout, the added power fill meshes and the existing metal wires in the layout together easily result in an excessively high metal wiring density of the layout, which exceeds a given upper limit and affects the planarization of the wafer surface by the CMP process.

Figure 1:
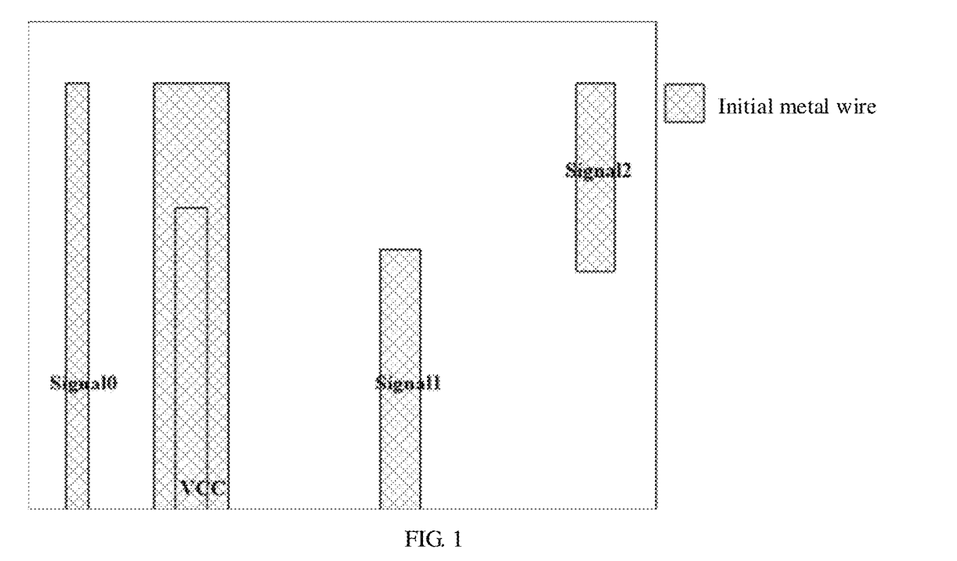
FIG. 1 is a partial schematic diagram of a layout without power fill meshes according to an embodiment of the present application.

For better understanding of the embodiments of the present application, referring to FIG. 1, FIG. 1 is a partial schematic diagram of a layout without power fill meshes according to an embodiment of the present application.

In the layout shown in FIG. 1, initial metal wires are provided, where the initial metal wires are the original metal wires in the initial layout.

Figure 2:
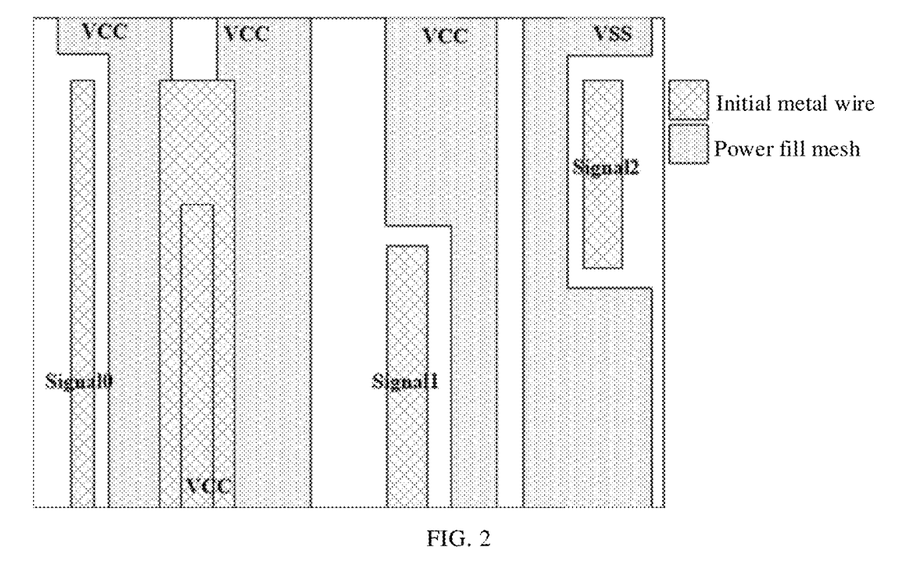
FIG. 2 is a partial schematic diagram of a layout added with power fill meshes according to an embodiment of the present application.

Referring to FIG. 2, FIG. 2 is a partial schematic diagram of a layout added with power fill meshes according to an embodiment of the present application.

As shown in FIG. 2, after power fill meshes are added to the layout, the added power fill meshes may be closely attached to the existing metal wires in the layout, or may be spaced apart from the existing metal wires in the layout.

It can be seen from FIG. 2 that, after the power fill meshes are added to the layout, there are more metal wires in the entire layout, resulting in an excessively high metal wiring density of the layout. Such physical verification errors of the excessively high metal wiring density caused by the power fill meshes added to the layout will occupy a large area on the full chip. In the layout process, it takes a lot of time and effort to reduce the metal wiring density in the layout to be lower than a specific threshold by modifying the power fill meshes in such a large area.

To solve the foregoing technical problem, the embodiments of the present application provide a method for adjusting metal wiring density. By detecting metal wiring density in each of metal density detection windows in a target layout, a region in which the metal wiring density is greater than a preset density threshold can be quickly positioned in the target layout, thereby improving the layout correction efficiency; then through multiple iterations, a power fill mesh in a target metal density detection window in which the metal wiring density is greater than the preset density threshold is cropped progressively, until the metal wiring density in each of the metal density detection windows is less than or equal to the preset density threshold, such that sufficient power fill meshes are retained in the target layout while the metal wiring density of the target layout is less than or equal to the preset density threshold. The embodiments are described in detail below.

In a feasible implementation, an entity executing the above method for adjusting metal wiring density can be any type of terminal device such as a mobile terminal, a tablet computer, a notebook computer, a desktop computer, etc. The terminal device is installed with relevant client software, which can provide a user interface, and the user interface can be used to design, layout, crop, detect and display the layout according to received user operations.

Figure 3:
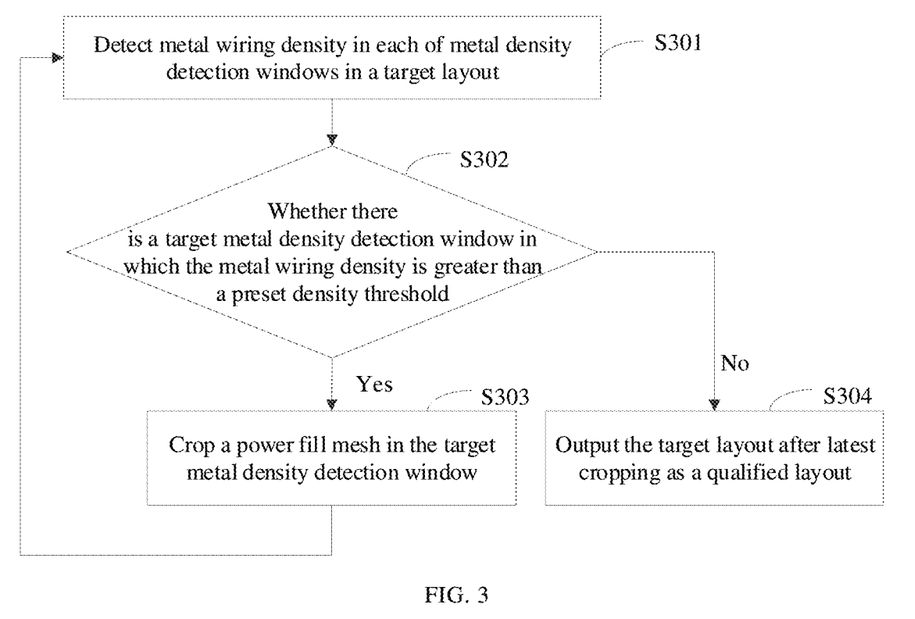
FIG. 3 is a schematic flowchart of a method for adjusting metal wiring density according to an embodiment of the present disclosure.

Referring to FIG. 3, FIG. 3 is a schematic flowchart of a method for adjusting metal wiring density according to an embodiment of the present disclosure. In a feasible implementation, the method for adjusting metal wiring density includes the following steps:

S301: Detect metal wiring density in each of metal density detection windows in a target layout.

In a feasible implementation, an initial layout may be obtained first, and power fill meshes are added to the initial layout, to form the target layout, where the initial layout includes initial metal wires.

Before the metal wiring density of the target layout is detected, a plurality of metal density detection windows which do not overlap each other may be created in the target layout first, and then the metal wiring density in each of the metal density detection windows in the target layout is detected.

Figure 4:
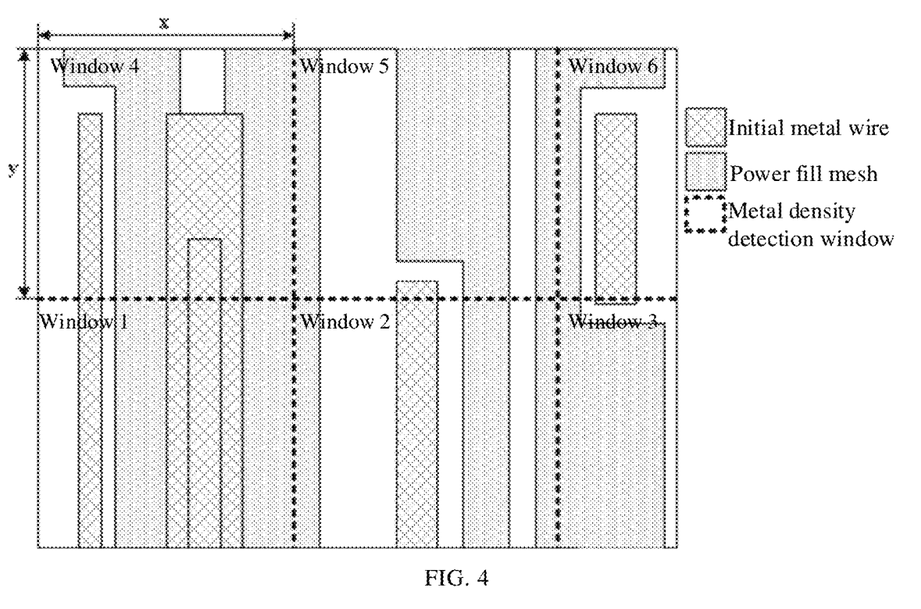
FIG. 4 is a partial schematic diagram of a target layout in which metal density detection windows are created according to an embodiment of the present application.

For better understanding of the embodiments of the present application, referring to FIG. 4, FIG. 4 is a partial schematic diagram of a target layout in which metal density detection windows are created according to an embodiment of the present application.

In FIG. 4, the entire layout may be divided into multiple different metal density detection windows according to a preset size (x, y) of the metal density detection window.

In the embodiments of the present application, a metal wiring density value P in each of the metal density detection windows may be calculated in the following manner:

$$P=(S1+S2)/S$$

where S1 represents an area of the power fill mesh added in the metal density detection window, S2 represents an area of the initial metal wires in the metal density detection window, and S represents an area of the metal density detection window.

That is, in the embodiments of the present application, the area of the power fill mesh added to each of the metal density detection windows and the area of the initial metal wires in each of the metal density detection windows are detected, and with reference to the area of each of the metal density detection windows, the metal wiring density value in each of the metal density detection windows can be calculated.

S302: Determine whether there is a target metal density detection window in which the metal wiring density is greater than a preset density threshold among the metal density detection windows. If yes, perform step S303; otherwise, perform step S304.

The preset density threshold is an upper limit, of the metal wiring density, set by a processing technology corresponding to the target layout.

In the embodiments of the present application, after the metal wiring density in each of the metal density detection windows in the target layout is determined, it is determined whether the metal wiring density in each of the metal density detection windows is greater than the preset density threshold; if yes, a target metal density detection window in which the metal wiring density is greater than the preset density threshold is outputted in a detection report.

Figure 5:
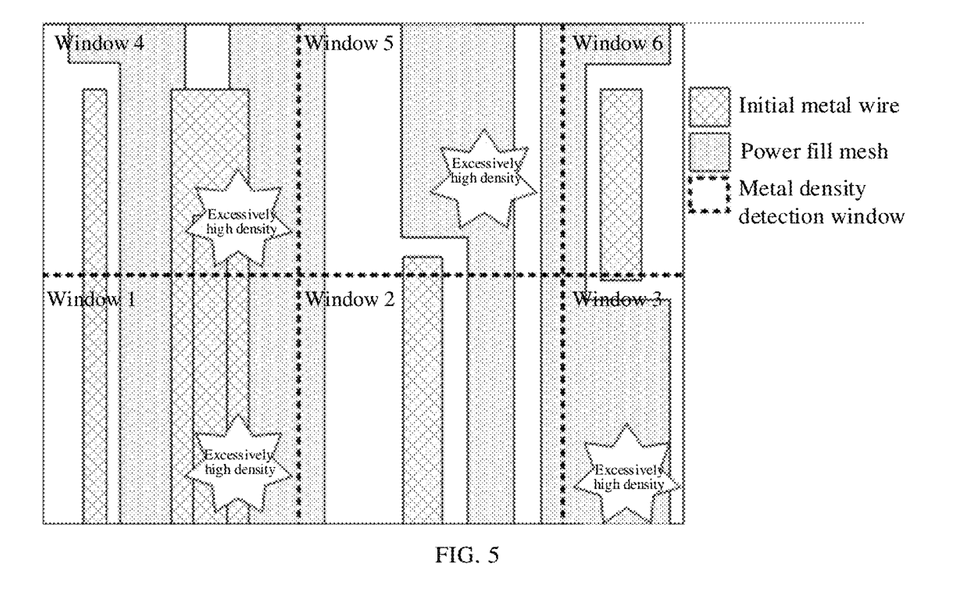
FIG. 5 is a schematic diagram of a detection result indicating whether there is a target metal density detection window in a target layout according to an embodiment of the present application.

For better understanding of the embodiments of the present application, referring to FIG. 5, FIG. 5 is a schematic diagram of a detection result indicating whether there is a target metal density detection window in a target layout according to an embodiment of the present application.

As shown in FIG. 5, window 1, window 3, window 4, and window 5 in the target layout are all target metal density detection windows in which the metal wiring density is greater than the preset density threshold.

S303: Crop a power fill mesh in the target metal density detection window.

In the embodiments of the present application, after the target metal density detection window is determined, the power fill mesh in the target metal density detection window is cropped, to reduce the area of the power fill mesh in the target metal density detection window, thereby reducing the metal wiring density in the target metal density detection window.

In the embodiments of the present application, the power fill mesh in the target metal density detection window may be cropped slightly, and after the cropping, step S301 is performed again, to detect the metal wiring density in each of the metal density detection windows again.

When there is still a target metal density detection window in which the metal wiring density is greater than the preset density threshold in the new detection result of the metal wiring density, the power fill mesh in the target metal density detection window in the new detection result of the metal wiring density is cropped slightly, and after the cropping, step S301 is performed again. This process is repeated, until the metal wiring density in each of the metal density detection windows is less than or equal to the preset density threshold.

S304: Output the target layout after latest cropping as a qualified layout.

In the embodiments of the present application, when the metal wiring density in each of the metal density detection windows in the target layout is less than or equal to the preset density threshold, the target layout after latest cropping can be outputted as a qualified layout.

It should be understood that, when there is a target metal density detection window in which the metal wiring density is greater than the preset density threshold among the metal density detection windows, by means of iterations, the power fill mesh in the target metal density detection window is cropped multiple times, which can ensure that the metal wiring density in each of the metal density detection windows in the target layout is less than or equal to the preset density threshold, while sufficient power fill meshes can be retained in the target layout.

According to the method for adjusting metal wiring density provided by the embodiments of the present application, by detecting metal wiring density in each of metal density detection windows in a target layout, a region in which the metal wiring density is greater than a preset density threshold can be quickly positioned in the target layout, thereby improving the layout correction efficiency; then a power fill mesh in a target metal density detection window in which the metal wiring density is greater than the preset density threshold is cropped multiple times, until the metal wiring density in each of the metal density detection windows is less than or equal to the preset density threshold, such that sufficient power fill meshes are retained in the target layout while the metal wiring density of the target layout is less than or equal to the preset density threshold.

Based on the content described in the foregoing embodiment, in a possible implementation of the present application, a small cropping size value delta may be set in advance. During cropping of the power fill mesh in the target metal density detection window, edges of the power fill mesh in the target metal density detection window are cropped according to the cropping size value delta.

Optionally, the edges of the power fill mesh in the target metal density detection window may be cropped as a whole from outside to inside according to the cropping size value delta.

Figure 6:
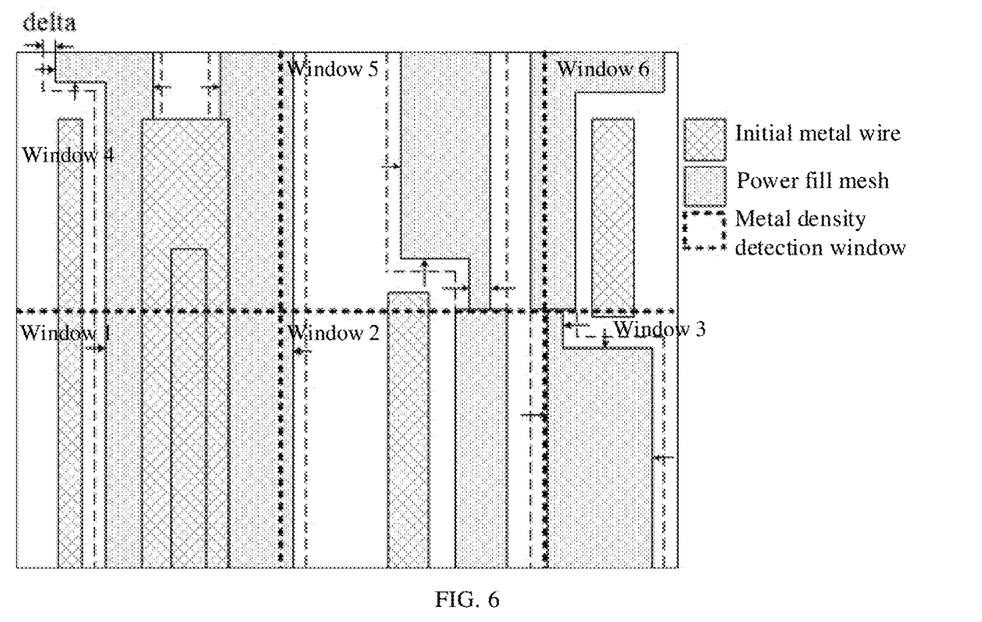
FIG. 6 is a partial schematic diagram of a target layout after edges of a power fill mesh in a target metal density detection window are cropped according to an embodiment of the present application.

For better understanding of the embodiments of the present application, referring to FIG. 6, FIG. 6 is a partial schematic diagram of a target layout after edges of a power fill mesh in a target metal density detection window are cropped according to an embodiment of the present application.

The dashed lines in FIG. 6 represent positions of the edges before cropping of the power fill meshes.

After the edges of the power fill mesh in the target metal density detection window are cropped, the metal wiring density in each of the metal density detection windows in the target layout is continuously detected, or the metal wiring density in the target metal density detection window after the latest cropping is detected again.

When there is still a target metal density detection window in which the metal wiring density is greater than the preset density threshold in the detection report, edges of the power fill mesh in the target metal density detection window are continuously cropped as a whole from outside to inside according to the cropping size value delta, and after the cropping, the metal wiring density in each of the metal density detection windows in the target layout is continuously detected, or the metal wiring density in the target metal density detection window after the latest cropping is detected again, until there is no target metal density detection window in which the metal wiring density is greater than the preset density threshold in the detection in the detection result.

Figure 7:
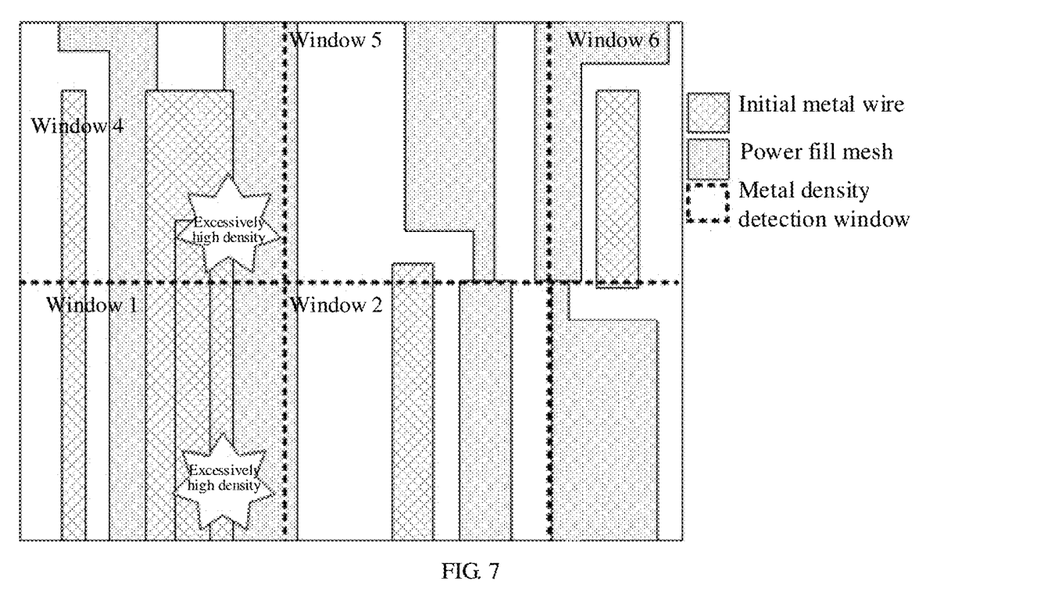
FIG. 7 is a schematic diagram of another detection result indicating whether there is a target metal density detection window in a target layout according to an embodiment of the present application.

For better understanding of the embodiments of the present application, assuming that the metal wiring density in window 1 and window 4 is still greater than the preset density threshold after the power fill meshes in the target metal density detection windows shown in FIG. 6 are cropped, window 1 and window 4 are used as the target metal density detection windows in the latest detection report. Referring to FIG. 7, FIG. 7 is a schematic diagram of another detection result indicating whether there is a target metal density detection window in a target layout according to an embodiment of the present application.

After a latest detection report is obtained, the edges of the power fill mesh in the target metal density detection window in the detection report may be cropped as a whole from outside to inside according to the foregoing cropping size value delta.

Figure 8:
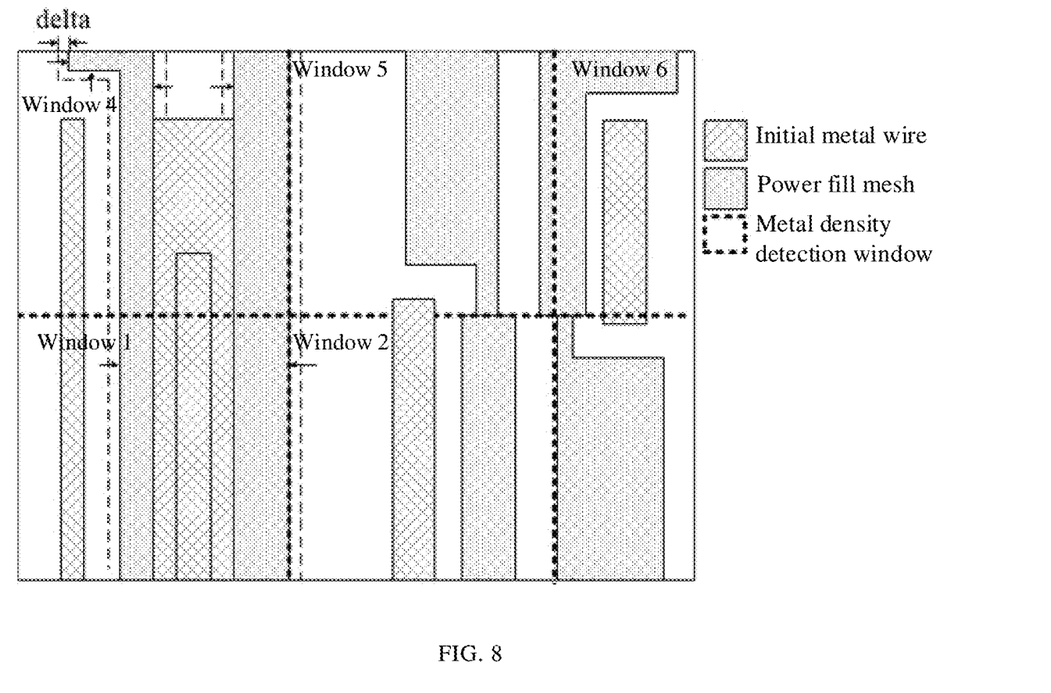
FIG. 8 is another schematic diagram after cropping of edges of a power fill mesh in a target metal density detection window according to an embodiment of the present application.

For better understanding of the embodiments of the present application, referring to FIG. 8, FIG. 8 is another schematic diagram after cropping of edges of a power fill mesh in a target metal density detection window according to an embodiment of the present application.

The dashed lines in FIG. 8 represent positions of the edges before cropping of the power fill meshes.

After the cropping, the metal wiring density in each of the metal density detection windows in the target layout is continuously detected, or the metal wiring density in the target metal density detection window after the latest cropping is detected again. If there is no target metal density detection window in which the metal wiring density is greater than the preset density threshold in the latest detection report, the target layout after the latest cropping is outputted as a qualified layout.

According to the method for adjusting metal wiring density provided by the embodiments of the present application, by detecting metal wiring density in each of metal density detection windows in a target layout, a region in which the metal wiring density is greater than a preset density threshold can be quickly positioned in the target layout, thereby improving the layout correction efficiency, and saving a lot of time and effort for layout engineers. Moreover, by means of iterations, the power fill mesh in the target metal density detection window is cropped slightly multiple times, such that sufficient power fill meshes can be retained in the target layout while the metal wiring density in each of the metal density detection windows in the target layout is less than or equal to the preset density threshold.

Based on the content described in the foregoing embodiments, in some embodiments, after the power fill mesh in the target metal density detection window in which the metal wiring density is greater than the preset density threshold in the target layout is cropped, a blank gap may be formed between the cropped power fill mesh and an end of an initial metal wire in the target layout.

Figure 9:
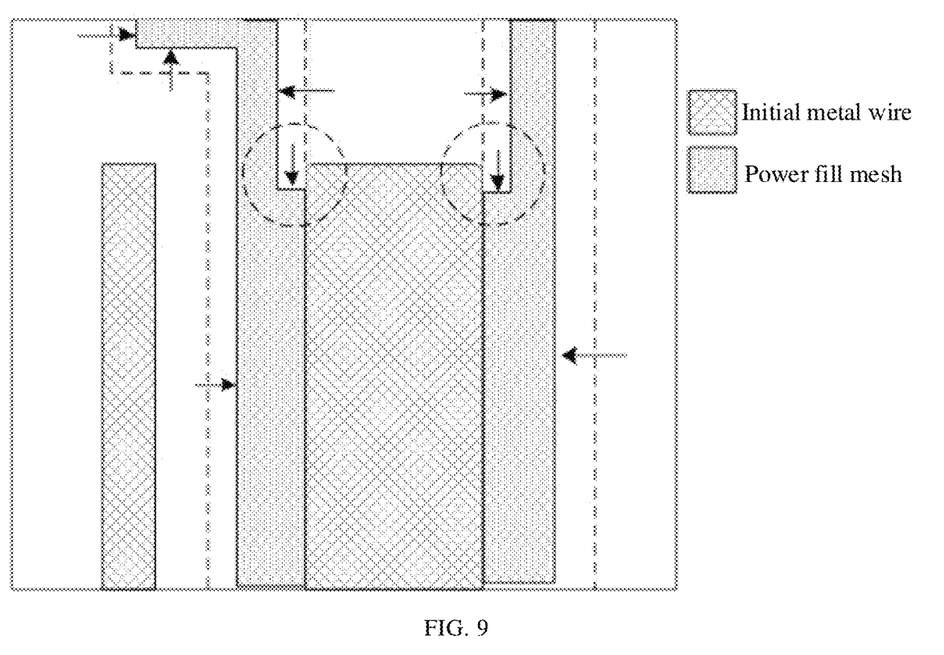
FIG. 9 is still another schematic diagram after cropping of edges of a power fill mesh in a target metal density detection window according to an embodiment of the present application.

For better understanding of the embodiments of the present application, referring to FIG. 9, FIG. 9 is still another schematic diagram after cropping of edges of a power fill mesh in a target metal density detection window according to an embodiment of the present application.

In FIG. 9, blank gaps in the dashed circles are the blank gaps formed between the cropped power fill meshes and the ends of the initial metal wires in the target layout. The blank gaps will affect other processes in subsequent manufacturing of the metal layer mask and decrease the performance of the chip.

In a feasible implementation of the present application, after the power fill mesh in the target metal density detection window in which the metal wiring density is greater than the preset density threshold in the target layout is cropped, if the metal wiring density in each of the metal density detection windows in the target layout in the latest detection report is less than or equal the preset density threshold, it is detected whether there is any blank gap between the cropped power fill meshes in the target layout and ends of the initial metal wires in the target layout; and if yes, power fill meshes are filled in the blank gaps.

Figure 10:
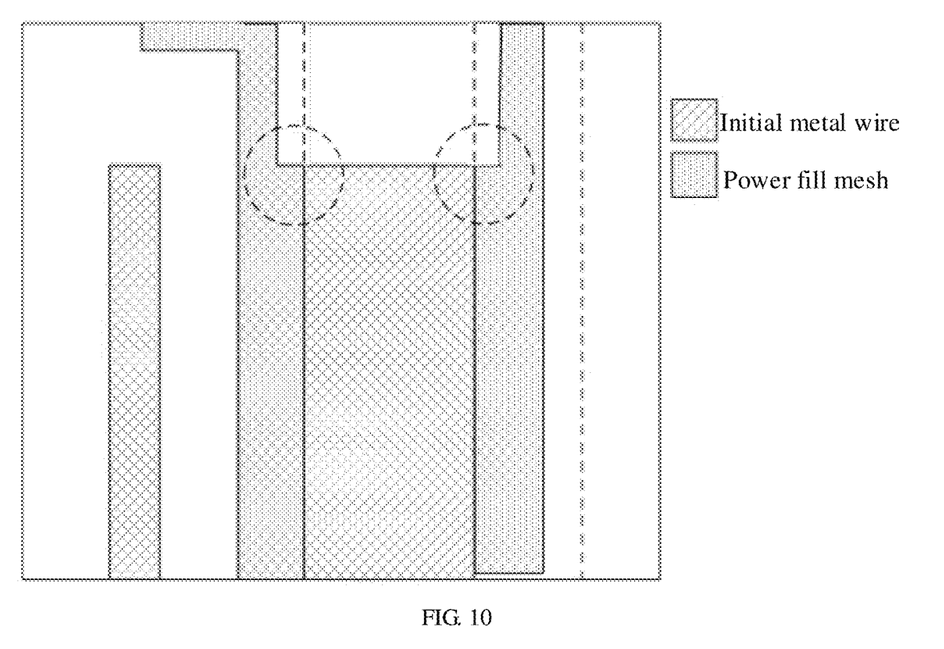
FIG. 10 is a schematic diagram after filling of blank gaps in a target layout according to an embodiment of the present application.

For better understanding of the embodiments of the present application, referring to FIG. 10, FIG. 10 is a schematic diagram after filling of blank gaps in a target layout according to an embodiment of the present application.

In the method for adjusting metal wiring density provided by the embodiments of the present application, the power fill mesh in the target metal density detection window is cropped, to ensure that the metal wiring density in each of the metal density detection windows in the target layout is less than or equal to the preset density threshold. After that, if there is any blank gap between the cropped power fill meshes in the target layout and the ends of the initial metal wires in the target layout, a power fill mesh is added to the blank gap, to avoid affecting other processes in subsequent manufacturing of the metal layer mask and improve the performance of the chip.

Figure 11:
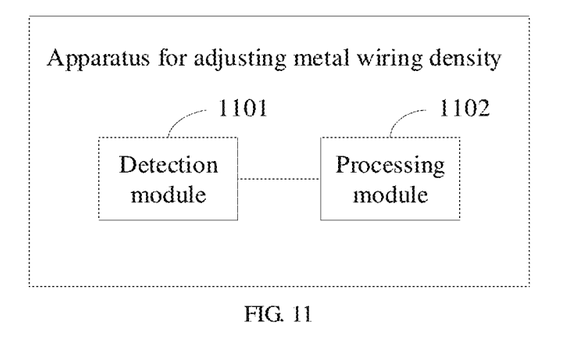
FIG. 11 is a schematic diagram of program modules of an apparatus for adjusting metal wiring density according to an embodiment of the present application.

Based on the content described in the foregoing embodiments, an embodiment of the present application further provides an apparatus for adjusting metal wiring density. Referring to FIG. 11, FIG. 11 is a schematic diagram of program modules of an apparatus for adjusting metal wiring density according to an embodiment of the present application. The apparatus for adjusting metal wiring density includes:

a detection module 1101, configured to detect metal wiring density in each of metal density detection windows in a target layout; and a processing module 1102, configured to: when there is a target metal density detection window in which the metal wiring density is greater than a preset density threshold among the metal density detection windows, crop a power fill mesh in the target metal density detection window; and return to run the detection module 1101, until the metal wiring density in each of the metal density detection windows in the target layout is less than or equal to the preset density threshold.

According to the apparatus for adjusting metal wiring density provided by the embodiments of the present application, by detecting metal wiring density in each of metal density detection windows in a target layout, a region in which the metal wiring density is greater than a preset density threshold can be quickly positioned in the target layout, thereby improving the layout correction efficiency; then a power fill mesh in a target metal density detection window in which the metal wiring density is greater than the preset density threshold is cropped multiple times, until the metal wiring density in each of the metal density detection windows is less than or equal to the preset density threshold, such that sufficient power fill meshes are retained in the target layout while the metal wiring density of the target layout is less than or equal to the preset density threshold.

In a feasible implementation, the processing module 1102 is configured to:
crop edges of the power fill mesh in the target metal density detection window based on a preset cropping size value.

In a feasible implementation, the processing module 1102 is configured to:
crop the edges of the power fill mesh in the target metal density detection window as a whole from outside to inside according to the cropping size value.

In a feasible implementation, the preset density threshold is an upper limit, of the metal wiring density, set by a processing technology corresponding to the target layout.

In a feasible implementation, the processing module 1102 is configured to:
when there is a target metal density detection window in which the metal wiring density is greater than the preset density threshold among the metal density detection windows, crop the power fill mesh in the target metal density detection window, and return to run the detection module 1101; and when there is no target metal density detection window in which the metal wiring density is greater than the preset density threshold among the metal density detection windows, stop running the detection module 1101, and output the target layout after latest cropping as a qualified layout.

In a feasible implementation, after cropping the power fill mesh in the target metal density detection window, the detection module 1101 is configured to:
detect the metal wiring density in the target metal density detection window after latest cropping.

In a feasible implementation, the processing module 1102 is further configured to:
create a plurality of metal density detection windows which do not overlap each other, in the target layout.

In a feasible implementation, the processing module 1102 is further configured to:
add power fill meshes to an initial layout, to form the target layout, where the initial layout includes initial metal wires.

In a feasible implementation, the processing module 1102 is further configured to:
when the metal wiring density in each of the metal density detection windows in the target layout is less than or equal to the preset density threshold, detect whether there is any blank gap between the cropped power fill meshes in the target layout and ends of the initial metal wires in the target layout; and when there is blank gap between the cropped power fill meshes in the target layout and the ends of the initial metal wires in the target layout, add a power fill mesh to the blank gap.

It should be noted that, in the embodiments of the present application, for the content specifically executed by the detection module 1101 and the processing module 1102, reference may be made to the steps of the method for adjusting metal wiring density described in the foregoing embodiments, and details are not described herein again.

Further, based on the content described in the foregoing embodiments, an embodiment of the present application further provides an electronic device. The electronic device includes at least one processor and a memory. The memory stores computer executable instructions; and the at least one processor executes the computer executable instructions stored in the memory, to implement the steps in the method for adjusting metal wiring density as described in the foregoing embodiments, and details are not described herein again.

Figure 12:
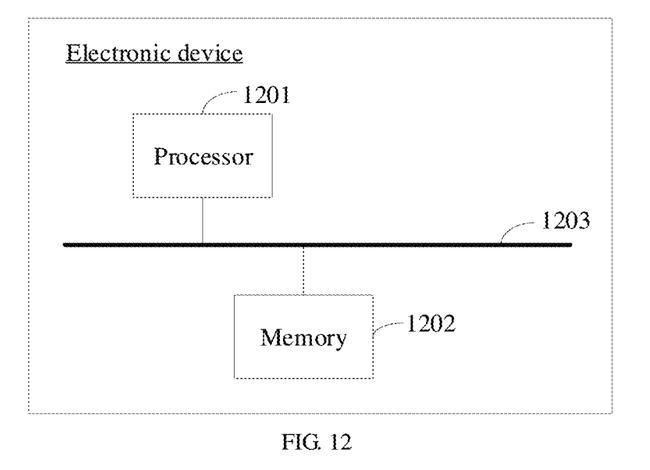
FIG. 12 is a schematic diagram of a hardware structure of an electronic apparatus according to an embodiment of the present application.

For better understanding of the embodiments of the present disclosure, referring to FIG. 12, FIG. 12 is a schematic diagram of a hardware structure of an electronic device according to an embodiment of the present application.

As shown in FIG. 12, an electronic device of this embodiment includes: a processor 1201 and a memory 1202, where
the memory 1202 is configured to store computer executable instructions; and
the processor 1201 is configured to execute the computer executable instructions stored in the memory, to implement the steps in the method for adjusting metal wiring density as described in the foregoing embodiments. Reference may be made to the related description in the foregoing method embodiments, and details are not described herein again.

Optionally, the memory 1202 may be independent or integrated with the processor 1201.

When the memory 1202 is independent, the apparatus further includes a bus 1203, configured to connect the memory 1202 and the processor 1201.

Further, based on the content described in the foregoing embodiments, an embodiment of the present application further provides a computer readable storage medium. The computer readable storage medium stores computer executable instructions. When a processor executes the computer executable instructions, the steps in the method for adjusting metal wiring density described in the foregoing embodiments are implemented. Reference may be made to the related description in the foregoing method embodiments, and details are not described herein again.

Further, based on the content described in the foregoing embodiments, an embodiment of the present application further provides a computer program product, including a computer program. When the computer program is executed by a processor, the steps in the method for adjusting metal wiring density described in the foregoing embodiments are implemented. Reference may be made to the related description in the foregoing method embodiments, and details are not described herein again.

In multiple embodiments provided herein, it should be understood that the disclosed apparatus and method may be implemented in other manners. For example, the described apparatus embodiment is merely an example. For example, the module division is merely a logical function division, and there may be may be other division manners in actual implementation. For example, a plurality of modules may be combined or integrated into another system, or some features may be ignored or may not be performed. In addition, the displayed or discussed mutual couplings or direct couplings or communication connections may be implemented by using some interfaces. The indirect couplings or communication connections between the apparatuses or modules may be implemented in electric, mechanical, or other forms.

The modules described as separate parts may or may not be physically separate, and parts displayed as modules may or may not be physical units, may be located in one position, or may be distributed on a plurality of network elements. Some or all of the modules may be selected according to actual needs to achieve the objective of the solution of the embodiment.

In addition, functional units in the embodiments of the present application may be integrated into one processing unit, or each of the modules may exist alone physically, or two or more modules are integrated into one unit. The unit consisting of integrated modules may be implemented in a form of hardware, or may be implemented in a form of hardware plus software functional units.

The integrated module implemented in the form of a software functional module may be stored in a computer readable storage medium. The software functional module is stored in a storage medium and includes instructions to cause a computer device (which may be a personal computer, a server, a network device, or the like) or a processor to perform some of the steps of the methods described in the embodiments of the present application.

It should be noted that, the processor may be a central processing unit (CPU), or may be a general processor, a digital signal processor (DSP), an application-specific integrated circuit (ASIC), or the like. The general processor may be a microprocessor, or the processor may also be any conventional processor. The steps of each method disclosed by the present disclosure can be directly performed by a hardware processor, or by a combination of hardware in a processor and a software module.

The memory may include a high-speed random access memory (RAM), or may further include a non-volatile memory (NVM), for example, at least one magnetic disk memory, or may further be a USB flash disk, a mobile hard disk, a read-only memory, a magnetic disk or an optical disc.

The bus may be an industry standard architecture (ISA) bus, a peripheral component interconnect (PCI) bus, an extended industry standard architecture (EISA) bus, or the like. The bus may be classified into an address bus, a data bus, a control bus, and the like. For ease of representation, the bus in the drawings of the present application is not limited to only one bus or only one type of bus.

The memory may be implemented by any type of volatile or non-volatile storage device or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic disk or an optical disc. The storage medium may be any usable medium accessible by a general-purpose computer, a special-purpose computer.

For example, a storage medium is coupled to a processor, so that the processor can read information from the storage medium or write information into the storage medium. Certainly, the storage medium may alternatively be a component of the processor. The processor and the storage medium may be located in an application specific integrated circuit (ASIC). Certainly, the processor and the storage medium may also be located in an electronic device or a main control device.

Those of ordinary skill in the art can understand that all or some of the steps in the foregoing method embodiments may be implemented by a program instructing relevant hardware. The program may be stored in a computer readable storage medium. When the program runs, the steps of the method embodiments are performed. The foregoing storage medium includes: any medium that can store program code, such as a ROM, a RAM, a magnetic disk, or an optical disc.

Finally, it should be noted that the above embodiments are merely used to explain the technical solutions of the present application, but are not intended to limit the present application. Although the present application is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the spirit and scope of the technical solutions of the embodiments of the present application.

The invention claimed is:

1. A method for adjusting metal wiring density, comprising:
    detecting metal wiring density in each of metal density detection windows in a target layout;
    when there is a target metal density detection window in which the metal wiring density is greater than a preset density threshold among the metal density detection windows, cropping a power fill mesh in the target metal density detection window;
    returning to detect the metal wiring density in each of the metal density detection windows in the target layout, until the metal wiring density in each of the metal density detection windows in the target layout is less than or equal to the preset density threshold;
    wherein before the detecting metal wiring density in each of metal density detection windows in a target layout, the method for adjusting metal wiring density further comprises:
        adding power fill meshes to an initial layout, to form the target layout, wherein the initial layout comprises initial metal wires;
    when the metal wiring density in each of the metal density detection windows in the target layout is less than or equal to the preset density threshold, detecting whether there is a blank gap between cropped power fill meshes in the target layout and ends of the initial metal wires in the target layout; and
    when there is the blank gap between the cropped power fill meshes in the target layout and the ends of the initial metal wires in the target layout, adding the power fill meshes to the blank gap.

2. The method for adjusting metal wiring density of claim 1, wherein the cropping a power fill mesh in the target metal density detection window comprises:
    cropping edges of the power fill mesh in the target metal density detection window based on a preset cropping size value.

3. The method for adjusting metal wiring density of claim 2, wherein the cropping edges of the power fill mesh in the target metal density detection window based on a preset cropping size value comprises:

cropping the edges of the power fill mesh in the target metal density detection window as a whole from outside to inside according to the preset cropping size value.

4. The method for adjusting metal wiring density of claim 1, wherein the preset density threshold is an upper limit, of the metal wiring density, set by a processing technology corresponding to the target layout.

5. The method for adjusting metal wiring density of claim 1, wherein the returning to detect the metal wiring density in each of the metal density detection windows in the target layout, until the metal wiring density in each of the metal density detection windows in the target layout is less than or equal to the preset density threshold comprises:
returning to detect the metal wiring density in each of the metal density detection windows in the target layout after cropping;
when there is the target metal density detection window in which the metal wiring density is greater than the preset density threshold among the metal density detection windows, cropping the power fill mesh in the target metal density detection window, and continuing to detect the metal wiring density in each of the metal density detection windows in the target layout after cropping; and
when there is no target metal density detection window in which the metal wiring density is greater than the preset density threshold among the metal density detection windows, stopping detecting the metal wiring density in each of the metal density detection windows in the target layout, and outputting the target layout after latest cropping as a qualified layout.

6. The method for adjusting metal wiring density of claim 5, wherein the returning to detect the metal wiring density in each of the metal density detection windows in the target layout after cropping comprises:
returning to detect the metal wiring density in the target metal density detection window after latest cropping.

7. The method for adjusting metal wiring density of claim 1, wherein before the detecting metal wiring density in each of metal density detection windows in a target layout, the method for adjusting metal wiring density further comprises:
creating a plurality of metal density detection windows which do not overlap each other, in the target layout.

8. An electronic device, comprising: at least one processor and a memory, wherein
the memory stores computer executable instructions; and
the at least one processor executes the computer executable instructions stored by the memory, such that the at least one processor performs the method for adjusting metal wiring density of claim 1.

9. A non-transitory computer readable storage medium, wherein the non-transitory computer readable storage medium stores computer executable instructions, wherein when the computer executable instructions are executed by a processor, the method for adjusting metal wiring density of claim 1 is implemented.

10. An apparatus for adjusting metal wiring density, comprising:
a detection module, configured to detect metal wiring density in each of metal density detection windows in a target layout; and
a processing module, configured to:
add power fill meshes to an initial layout, to form the target layout, wherein the initial layout comprises initial metal wires;
when there is a target metal density detection window in which the metal wiring density is greater than a preset density threshold among the metal density detection windows, crop a power fill mesh in the target metal density detection window;
return to run the detection module, until the metal wiring density in each of the metal density detection windows in the target layout is less than or equal to the preset density threshold;
when the metal wiring density in each of the metal density detection windows in the target layout is less than or equal to the preset density threshold, detect whether there is a blank gap between cropped power fill meshes in the target layout and ends of the initial metal wires in the target layout; and
when there is the blank gap between the cropped power fill meshes in the target layout and the ends of the initial metal wires in the target layout, add the power fill meshes to the blank gap.

11. The apparatus for adjusting metal wiring density of claim 10, wherein the processing module is configured to:
crop edges of the power fill mesh in the target metal density detection window based on a preset cropping size value.

12. The apparatus for adjusting metal wiring density of claim 11, wherein the processing module is configured to:
crop the edges of the power fill mesh in the target metal density detection window as a whole from outside to inside according to the preset cropping size value.

13. The apparatus for adjusting metal wiring density of claim 10, wherein the preset density threshold is an upper limit, of the metal wiring density, set by a processing technology corresponding to the target layout.

14. The apparatus for adjusting metal wiring density of claim 10, wherein the processing module is configured to:
when there is the target metal density detection window in which the metal wiring density is greater than the preset density threshold among the metal density detection windows, crop the power fill mesh in the target metal density detection window, and return to run the detection module; and
when there is no target metal density detection window in which the metal wiring density is greater than the preset density threshold among the metal density detection windows, stop running the detection module, and output the target layout after latest cropping as a qualified layout.

15. The apparatus for adjusting metal wiring density of claim 14, wherein after cropping the power fill mesh in the target metal density detection window, the detection module is configured to:
detect the metal wiring density in the target metal density detection window after latest cropping.

16. The apparatus for adjusting metal wiring density of claim 10, wherein the processing module is further configured to:
create a plurality of metal density detection windows which do not overlap each other, in the target layout.

* * * * *